United States Patent
Park et al.

(10) Patent No.: US 9,583,542 B2
(45) Date of Patent: Feb. 28, 2017

(54) ORGANIC LIGHT EMITTING DISPLAY APPARATUS

(71) Applicant: SAMSUNG DISPLAY CO., LTD., Yongin, Gyeonggi-Do (KR)

(72) Inventors: Kyongtae Park, Yongin (KR); Donghoon Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

(21) Appl. No.: 14/796,958

(22) Filed: Jul. 10, 2015

(65) Prior Publication Data

US 2016/0218155 A1  Jul. 28, 2016

(30) Foreign Application Priority Data

Jan. 28, 2015  (KR) .................. 10-2015-0013548

(51) Int. Cl.
*H01L 27/32* (2006.01)

(52) U.S. Cl.
CPC ...... *H01L 27/3223* (2013.01); *H01L 27/3262* (2013.01); *H01L 27/3265* (2013.01); *H01L 27/3276* (2013.01)

(58) Field of Classification Search
CPC ............. H01L 27/3223; H01L 27/3262; H01L 27/3265; H01L 27/3276
See application file for complete search history.

(56) References Cited

U.S. PATENT DOCUMENTS

| 2014/0183481 | A1 | 7/2014 | Lee et al. |
| 2014/0292827 | A1* | 10/2014 | Kang ............... G09G 3/20 345/690 |
| 2014/0347347 | A1 | 11/2014 | Jeong et al. |
| 2015/0102312 | A1 | 4/2015 | Lee et al. |
| 2015/0262526 | A1 | 9/2015 | Park et al. |

FOREIGN PATENT DOCUMENTS

| KR | 10-0666639 B1 | 1/2007 |
| KR | 10-2014-0086714 A | 7/2014 |
| KR | 10-2014-0137504 A | 12/2014 |
| KR | 10-2015-0044328 A | 4/2015 |
| KR | 10-2015-0107018 | 9/2015 |
| KR | 10-2015-0114115 | 10/2015 |

* cited by examiner

*Primary Examiner* — Kyoung Lee
(74) *Attorney, Agent, or Firm* — Lewis Roca Rothgerber Christie LLP

(57) ABSTRACT

An organic light emitting display apparatus includes: a plurality of pixels at a display area; a plurality of dummy pixels at a dummy area; and a plurality of repair lines that are connected to the plurality of dummy pixels and connectable to the plurality of pixels, wherein each of the plurality of dummy pixels includes: a compensation capacitive element; a driving transistor configured to output a driving current corresponding to a data signal applied to a gate electrode of the driving transistor; and a connection portion between a first electrode of the compensation capacitive element and the gate electrode of the driving transistor, and that is configured to electrically connect or separate the first electrode of the compensation capacitive element and the gate electrode of the driving transistor to or from each other based on a physical quantity applied to the connection portion.

16 Claims, 10 Drawing Sheets

ORGANIC LIGHT EMITTING DISPLAY APPARATUS

CROSS-REFERENCE TO RELATED APPLICATION

This application claims priority to and the benefit of Korean Patent Application No. 10-2015-0013548, filed on Jan. 28, 2015, in the Korean Intellectual Property Office, the entire content of which is incorporated herein by reference.

BACKGROUND

1. Field

One or more example embodiments relate to an organic light emitting display apparatus.

2. Description of the Related Art

During a manufacturing process of an organic light emitting display apparatus, a defect may be caused in a pixel circuit of a pixel (e.g., predetermined pixel). In this case, the pixel having the defect may emit light always regardless of a scan signal and a data signal or the pixel may be displayed black. A pixel as described above, which always emits light is perceived as a bright defect (or white point defect), and a pixel displayed black is perceived as a dark defect (or black point defect). Also, because of the complex circuitry in pixels of an organic light emitting display apparatus, it may be difficult to overcome a bright defect or a dark defect by repairing the pixel circuit of the pixel having the defect.

The above information disclosed in this Background section is only for enhancement of understanding of the background of the invention and therefore it may contain information that does not constitute prior art.

SUMMARY

One or more example embodiments relate to organic light emitting display apparatuses, and more particularly, to organic light emitting display apparatuses to which a repair process using a dummy pixel is applicable.

One or more example embodiments include an organic light emitting display device in which a pixel having a defect is repaired to drive the pixel normally, wherein a portion of a circuit structure of a dummy pixel used is modified after a repair process to thereby improve an image quality.

Additional aspects will be set forth in part in the description which follows and, in part, will be apparent from the description, or may be learned by practice of the presented embodiments.

According to one or more example embodiments, an organic light emitting display apparatus includes: a plurality of pixels at a display area; a plurality of dummy pixels at a dummy area; and a plurality of repair lines that are connected to the plurality of dummy pixels and connectable to the plurality of pixels, wherein each of the plurality of dummy pixels comprises: a compensation capacitive element; a driving transistor configured to output a driving current corresponding to a data signal applied to a gate electrode of the driving transistor; and a connection portion between a first electrode of the compensation capacitive element and the gate electrode of the driving transistor, and that is configured to electrically connect or separate the first electrode of the compensation capacitive element and the gate electrode of the driving transistor to or from each other based on a physical quantity applied to the connection portion.

Each of the plurality of dummy pixels may further include: an emission control transistor between an output node connected to a corresponding repair line among the plurality of repair lines and the driving transistor and that is controlled according to an emission control signal; a capacitance control transistor between the output node and a second electrode of the compensation capacitive element and is controlled according to the emission control signal; and a capacitive element initialization transistor between the capacitance control transistor and an initialization voltage line and is controlled according to an initialization control signal.

The connection portion may include: a first area connected to the first electrode of the compensation capacitive element; and a second area connected to the gate electrode of the driving transistor, wherein the first and second areas are electrically separated from each other, and are electrically connectable to each other by using a laser.

The connection portion may include: a first area connected to the first electrode of the compensation capacitive element; and a second area connected to the gate electrode of the driving transistor, wherein the first and second areas are electrically connected to each other, and are electrically separable from each other by using a laser.

Each of the plurality of pixels may include a pixel circuit and a light emitting device that is separably connected to the pixel circuit, and each of the plurality of dummy pixels comprises a dummy circuit.

One of the plurality of pixels may include a repair pixel, and the repair pixel may include a light emitting device that is separated from a pixel circuit of the repair pixel and is connected to a dummy circuit of a corresponding dummy pixel among the plurality of dummy pixels through a corresponding repair line among the plurality of repair lines.

The plurality of pixels may include a first pixel and a second pixel, and the connection portion may include: an emission control transistor between an output node connected to a corresponding repair line among the plurality of repair lines and the driving transistor and is controlled according to an emission control signal; a first capacitance control transistor between the output node and a compensation control node and is controlled according to the emission control signal; a capacitive element initialization transistor between the compensation control node and an initialization voltage line and is controlled according to an initialization signal; and a second capacitance control transistor between the compensation control node and a second electrode of the compensation capacitive element, and that electrically connects the compensation control node and the second electrode of the compensation capacitive element if the repair pixel is the first pixel, and that electrically separates the compensation control node and the second electrode of the compensation capacitive element if the repair pixel is the second pixel.

The dummy circuit of the corresponding dummy pixel may be configured to provide the light emitting device of the repair pixel with a driving current through the corresponding repair line.

According to some example embodiments, an organic light emitting display apparatus includes: first and second pixels at a display area; a dummy pixel at a dummy area and comprising a compensation capacitive element; and a repair line that is connected to the dummy pixel and is connectable to the first and second pixels, wherein the dummy pixel comprises: a driving transistor configured to output a driving current corresponding to a data signal applied to a gate electrode of the driving transistor; and a connection portion between a first electrode of the compensation capacitive element and the gate electrode of the driving transistor, and that electrically connects or separates the first electrode of the compensation capacitive element and the gate electrode of the driving transistor to or from each other based on a physical quantity applied to the connection portion.

The dummy pixel may further include: an emission control transistor between an output node connected to the repair line and the driving transistor and is controlled according to an emission control signal; a capacitance control transistor between the output node and a second electrode of the compensation capacitive element and is controlled according to the emission control signal; and a capacitive element initialization transistor between the capacitance control transistor and an initialization voltage line and is controlled according to an initialization control signal.

The connection portion may include: a first area connected to the first electrode of the compensation capacitive element; and a second area connected to the gate electrode of the driving transistor, wherein the first and second areas are electrically separated from each other, and are electrically connectable to each other by using a laser.

The connection portion may include: a first area connected to the first electrode of the compensation capacitive element; and a second area connected to the gate electrode of the driving transistor, wherein the first and second areas are electrically connected to each other, and are electrically separable from each other by using a laser.

Each of the first and second pixels may include a pixel circuit and a light emitting device that is separably connected to the pixel circuit, and the dummy pixel may include a dummy circuit.

One of the first and second pixels may include a repair pixel, and a light emitting device of the repair pixel is separated from a pixel circuit of the repair pixel and is connected to the dummy circuit of the dummy pixel through the repair line.

The connection portion may include: an emission control transistor between an output node connected to the repair line and the driving transistor and is controlled according to an emission control signal; a first capacitance control transistor between the output node and a compensation control node and is controlled according to the emission control signal; a capacitive element initialization transistor between the compensation control node and an initialization voltage line and is controlled according to an initialization signal; and a second capacitance control transistor between the compensation control node and a second electrode of the compensation capacitive element, and that electrically connects the compensation control node and the second electrode of the compensation capacitive element if the first pixel is the repair pixel, and that electrically separates the compensation control node and the second electrode of the compensation capacitive element if the second pixel is the repair pixel.

The dummy circuit of the dummy pixel may be configured to provide the light emitting device of the repair pixel with a driving current through the repair line.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
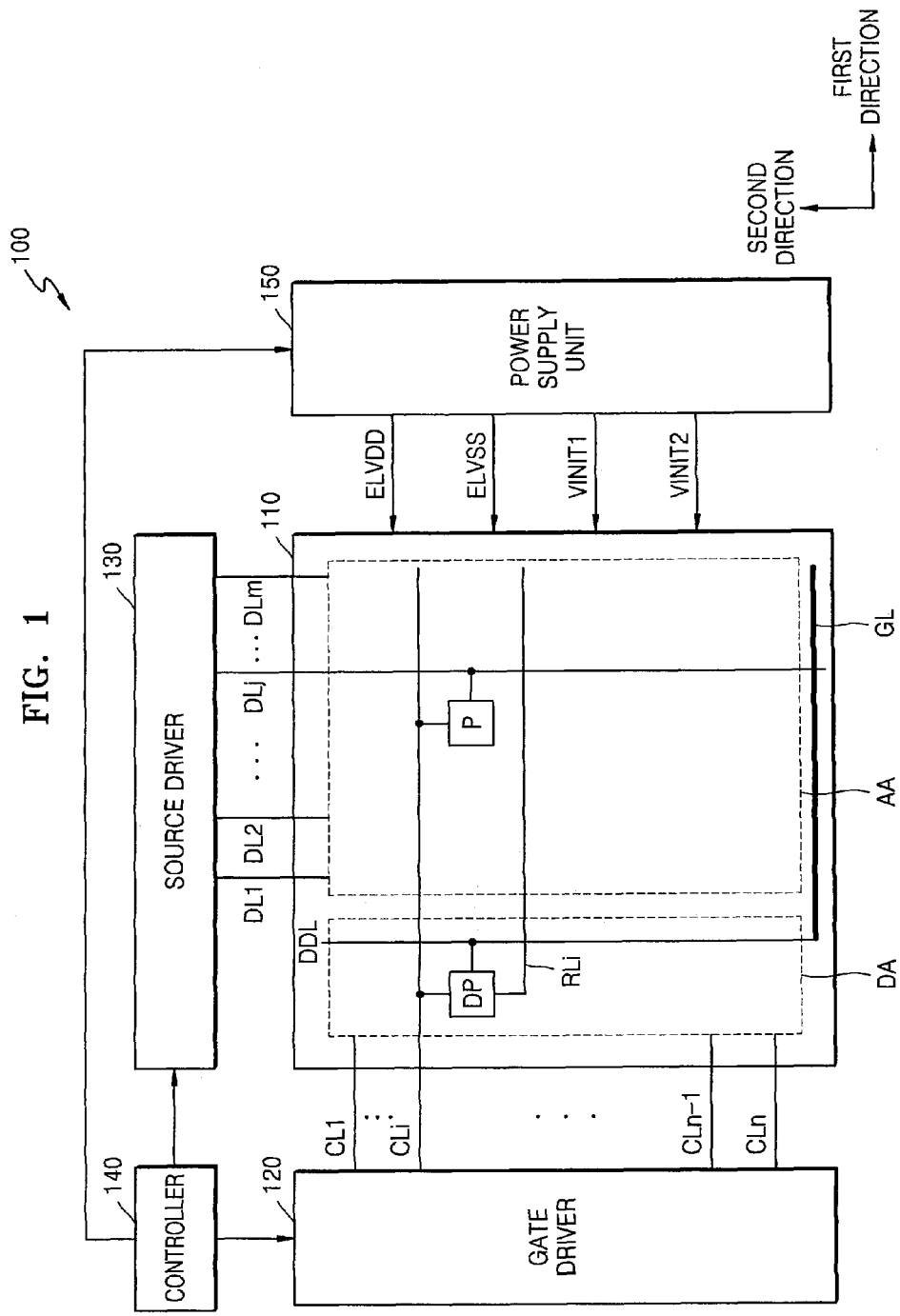
FIG. 1 schematically illustrates an organic light emitting display apparatus according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Reference will now be made in more detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Because the present invention may have various modifications and several embodiments, example embodiments are shown in the drawings and will be described in detail. Aspects, features, and a method of achieving the same will be specified with reference to the example embodiments described below in more detail, together with the attached drawings. However, the example embodiments may have different forms and should not be construed as being limited to the descriptions set forth herein.

The example embodiments of the present invention will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another. Singular expressions, unless defined otherwise in contexts, include plural expressions. It will be further understood that the terms "comprise" and/or "have" used herein specify the presence of stated features or components, but do not preclude the presence or addition of one or more other features or components.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 schematically illustrates an organic light emitting display apparatus 100 according to an example embodiment of the present invention.

Referring to FIG. 1, the organic light emitting display apparatus 100 may include a display unit 110, a gate driver 120, a source driver 130, a controller 140, and a power supply unit 150. The gate driver 120, the source driver 130, the controller 140, and the power supply unit 150 may be formed on different semiconductor chips or on a single semiconductor chip. Also, the gate driver 120 and/or the source driver 130 may be formed on the same substrate as the display unit 110. The organic light emitting display apparatus 100 may be an image display element of an electronic device such as a smartphone, a tablet PC, a notebook PC, a monitor, or a TV.

An active area (display area) AA and a dummy area DA may be defined in the display unit 110. The dummy area DA may be arranged or located in a non-display area adjacent to the active area AA. The dummy area DA may be arranged or located on the left and/or the right of the active area AA. According to another example embodiment, the dummy area DA may be arranged or located on and/or under the active area AA.

A plurality of pixels P coupled to a plurality of control lines CL1 through CLn extending in a first direction (e.g., a row direction) and a plurality of data lines DL1 through DLm extending in a second direction (e.g., a column direction) may be arranged in the active area AA. In the dummy area DA, a plurality of dummy pixels DP respectively coupled to a dummy data line DDL and corresponding control lines (e.g., a control line CLi) among a dummy data line DDL may be arranged. The dummy pixels DP may be arranged in the dummy area DA in a second direction.

While the control lines CL1 through CLn are illustrated each as a single signal line in FIG. 1, each of the control liens CL1 through CLn may include multiple signal lines. For example, the first control line CL1 may include three lines through which a scan signal GW, an initialization control signal GI, and an emission control signal EM are respectively applied.

The display unit 110 may include a plurality of repair lines RL1 through RLn extending from the control lines CL1 through CLn. The repair lines RL1 through RLn may be connected to the dummy pixels DP, or may be arranged to be connectable to the pixels P.

A unit pixel may include a plurality of subpixels respectively displaying multiple colors to display various colors. In the present specification, a pixel P mainly refers to a single subpixel. However, example embodiments of the present invention are not limited thereto, and a pixel P may also refer to a unit pixel including a plurality of subpixels. That is, according to the specification, a pixel P may be understood as including one subpixel or as including a plurality of subpixels that form one unit pixel. The same applies to a dummy pixel DP. For example, a dummy pixel DP may be understood as one dummy pixel or as including dummy subpixels corresponding to the number of subpixels that form one unit pixel. If one dummy pixel is understood as including a plurality of dummy subpixels, then a dummy data line connected to the dummy pixel also includes a plurality of data lines respectively connected to a plurality of dummy subpixels.

In the present specification, expressions "connectable" or "connectably" may indicate that an element is connectable by using a laser or the like in a repair process. For example, it may be understood that when a first member and a second member are arranged to be connectable to each other, the first member and the second member are currently actually not connected to each other but may be connected to each other in a repair process. From a structural perspective, the first member and the second member that are "connectable" to each other may be arranged to cross each other in an overlapping area and an insulation layer may be interposed therebetween. When a laser is irradiated to the overlapping area in a repair process, the insulation layer in the overlapping area is destroyed so that the first member and the second member are electrically connected to each other.

Also, in the present specification, expressions "separable" or "separably" may indicate that an element is separable using a laser or the like in a repair process. For example, it may be understood that when a first member and a second member are separably connected, the first member and the second member are currently actually connected to each other but may be separated (or electrically isolated) from each other in a repair process. From a structural perspective, the first member and the second member that are separably connected to each other may be arranged to be connected to each other by using a conductive connection member. When a laser is irradiated to the conductive connection member in a repair process, a portion of the conductive connection member to which the laser is irradiated is melted so that the conductive connection member is cut and the first member and the second member are electrically disconnected from (or electrically isolated from) each other. For example, the conductive connection member may include a silicon layer that may be melted by a laser. As another example, the conductive connection member may be melted by Joule heat generated due to a current to thereby be cut.

The display unit 110 may include a connection line GL that may be connected to the dummy data line DDL and is arranged to be connectable to the plurality of data lines DL1 through DLm. The connection line GL may extend in the first direction. The connection line GL may be arranged in dead space in an outer portion of the active area AA and the dummy area DA. The dead space may refer to an area of the display unit 110 where the pixels P and the dummy pixels DP are not arranged. As the connection line GL is arranged in the dead space, the connection line GL may have a large design margin. For example, the connection line GL may have a greater width and/or thickness in order to reduce resistance. A plurality of connection lines GL may be arranged in the display unit 110.

The gate driver 120 may provide a plurality of control signals CL1 through CLn to the pixels P and the dummy pixels DP via the plurality of control lines CL1 through CLn, and the source driver 130 may provide a data signal to the pixels P through the data lines DL1 through DLm. As illustrated in FIG. 1, the source driver 130 may not be directly connected to the dummy data line DDL. As another example, the source driver 130 may be directly connected to the dummy data line DDL so as to directly provide a data signal to the dummy pixels DP.

The controller 140 may control the gate driver 120, the source driver 130, and the power supply unit 150. The controller 140 may output a control signal for controlling the gate driver 120, the source driver 130, and/or the power supply unit 150 and image data to the gate driver 120, the source driver 130, and/or the power supply unit 150 based on a horizontal synchronization signal and a vertical synchronization signal. The power supply unit 150 may apply to the pixels P and/or the dummy pixels DP a first driving voltage ELVDD, a second driving voltage ELVSS, a first initialization voltage VINT1, and a second initialization voltage VINT2. The first initialization voltage VINT1 may be supplied to the pixels P, and the second initialization voltage VINT2 may be supplied to the dummy pixels DP. The first initialization voltage VINT1 and the second initialization voltage VINT2 may be the same or different voltages.

The pixels P may include a light emitting device and a pixel circuit that is separably connected to the light emitting device. The dummy pixels DP may include a dummy circuit. For example, if a pixel P illustrated in FIG. 1 is a defective pixel, a light emitting device of the defective pixel may be separated from a pixel circuit of the defective pixel, and the light emitting device of the defective pixel may be connected to a corresponding dummy pixel DP among the dummy pixels DP through a corresponding repair line RLi among repair lines RL1 through RLn. Also, a data line DLj connected to a defective pixel among the data lines DL1 through DLm may be connected to a dummy data line DDL via a connection line GL. A data signal applied to a defective pixel is applied to the dummy pixel DP through the data line DLj, the connection line GL connected to the data line DLj, and the dummy data line connected to the connection line GL. The dummy pixel DP generates a driving current corresponding to a data signal, and supplies the driving current to the light emitting device of the defective pixel via the repair line RLj. The light emitting device emits light of a luminance corresponding to the data signal. Thus, the light emitting device of the defective pixel operation normally due to the dummy pixel DP.

In the specification, expressions "corresponding" or "to correspond to" may indicate that an element is arranged on the same column or row according to context. For example, when a first member is connected to a "corresponding" second member among a plurality of second members, it may indicate that the first member is connected to a second member arranged on the same column or row as the first member.

Figure 2:
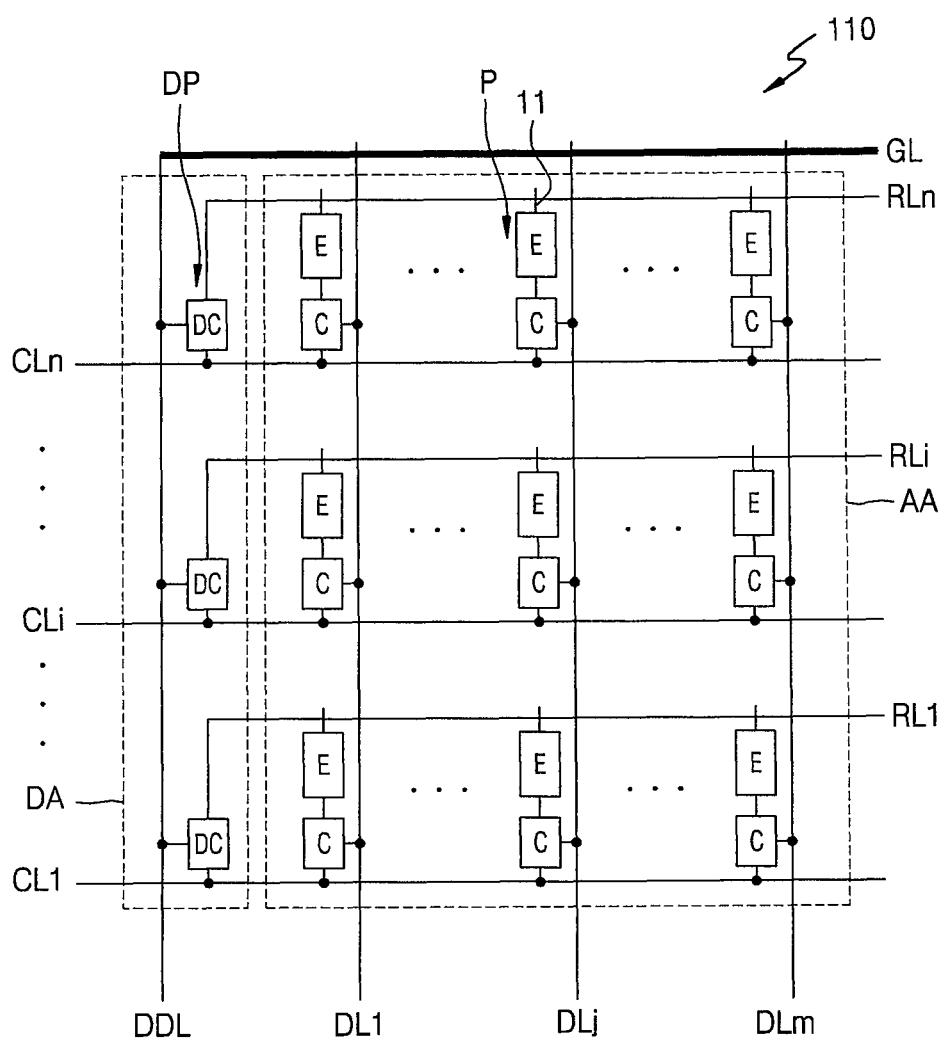
FIG. 2 schematically illustrates a display unit illustrated in FIG. 1 according to an example embodiment.

FIG. 2 schematically illustrates the display unit 110 illustrated in FIG. 1 according to an example embodiment.

Referring to FIG. 2, the display unit 110 may include an active area AA displaying an image via light emission and a dummy area DA around the active area AA.

A pixel P arranged in the active area AA may include a pixel circuit C and a light emitting device E emitting light by receiving a driving current from the pixel circuit C. The light emitting device E and the pixel circuit C may be separably connected to each other. The pixel circuit C may include at least one thin film transistor and at least one capacitive element. In the present specification, a capacitive element may refer to a capacitor. The pixel P may emit monochromic light, and may emit one of red, blue, green, and white color light. However, the example embodiments of the present invention are not limited thereto, and the pixel P may also emit light other colors than red, blue, green, or white light.

The light emitting device E of the pixel P may be insulated from a repair line of the same row, and may be electrically connected to the repair line in a subsequent repair process. That is, the light emitting device E of the pixel P may be arranged to be connectable to a repair line of the same row. For example, the light emitting device E may be electrically connected to a first connection member 11, and the first connection member 11 may be formed to partially overlap the repair line, with an insulating layer included between the first connection member 11 and the repair line. The first connection member 11 may include at least one conductive layer formed of a conductive material. In a repair process, when a laser is irradiated to an overlapping area between the first connection member 11 and the repair line, the insulation layer is destroyed, and the first connection member 11 and the repair line are shorted so as to be electrically connected to each other. Accordingly, the light emitting device E may be electrically connected to the repair line.

According to the example embodiment of FIG. 2, the dummy area DA is arranged on the left of the active area AA, and a dummy pixel DP is arranged on each row. A dummy data line DDL connected to the dummy pixels DP may be arranged in the dummy area DA. The dummy data line DDL may be arranged in parallel to data lines DL1 through DLm. Repair lines RL1 through RLn and the control lines CL1 through CLn may also extend in the dummy area DA.

The dummy pixel DP includes a dummy circuit DC but does not include a light emitting device. The dummy circuit DC may be the same as the pixel circuit C. According to another example embodiment, the dummy circuit DC may be different from the pixel circuit C. For example, the dummy circuit DC may be the pixel circuit C, from or to which a transistor and/or a capacitive element is omitted and/or added, and may differ in size and characteristics of the transistor and the capacitive element.

The connection line GL may be arranged in an outer portion of the active area AA and the dummy area DA. The connection line GL and data lines DL1 through DLm are insulated from each other, and the connection line GL and one of the data lines DL1 through DLm may be electrically connected to each other in a repair process. For example, the data lines DL1 through DLm may be arranged to overlap a portion of the connection line GL, with an insulating layer included therebetween. When a laser is irradiated to an overlapping area between a data line connected to a defect pixel and the connection line GL, the insulating layer is destroyed so that the data line and the connection line GL are shorted and the data line connected to the defect pixel and the connection line GL are electrically connected to each other.

Figure 3:
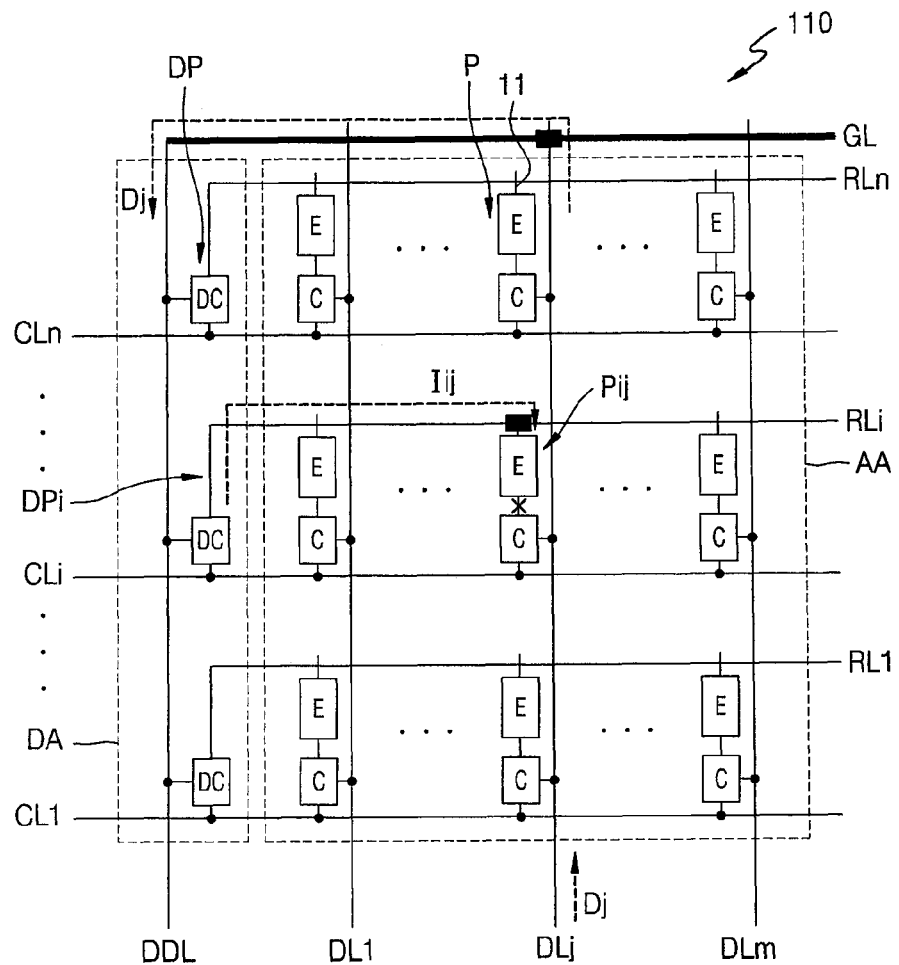
FIG. 3 is a diagram for explaining a method of repairing a pixel having a defect in the display unit illustrated in FIG. 2 by using a repair line.
Figure 3:
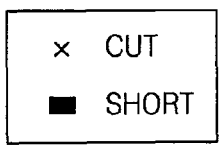

FIG. 3 is a diagram for explaining a method of repairing a pixel having a defect in the display unit 110 illustrated in FIG. 2 by using a repair line.

Hereinafter, an example embodiment in which a defect is generated in a pixel Pij that is connected to an ith control line CLi and a jth data line DLj among the pixels P formed in the active area AA, for example, when a pixel circuit C of the pixel Pij is defected, will be described. In the present example embodiment, the pixel Pij will be referred to as a defect pixel Pij.

Referring to FIG. 3, a light emitting device E of the defect pixel Pij may be separated from the pixel circuit C. For example, the light emitting device E of the defect pixel Pij may be separated from the pixel circuit C by cutting a connection area between the light emitting device E and the pixel circuit C by irradiating a laser to the connection area.

Next, the light emitting device E and the defect pixel Pij and a dummy circuit DC of a dummy pixel DPi may be electrically connected to each other. To this end, the light emitting device E of the defect pixel Pij may be connected to a repair line RLi of the same row. For example, by irradiating a laser to an overlapping area between the first connection member 11 connected to the light emitting device E of the defect pixel Pij and a repair line RLi of the same row, the light emitting device E may be electrically connected to the repair line RLi. As the repair line RLi is connected to the dummy circuit DC, the light emitting device E of the defect pixel Pij may be connected to the dummy circuit DC of the dummy pixel DPi.

Next, the data line DLj connected to the defect pixel Pij and the dummy data line DDL may be electrically connected to each other. To this end, the data line DLj may be connected to the connection line GL. For example, the data line DLj and the connection line GL may be electrically connected to each other by irradiating a laser to an overlapping area between the data line DLj and the connection line GL. The connection line GL is connected to the dummy data line DDL and thus the data line DLj and the data line DDL may be connected to each other.

The pixel circuit C of the defect pixel Pij and the dummy circuit DC of the dummy pixel DPi may concurrently (e.g., simultaneously) respond to a scan signal applied to the same scan line along the control line CLi. The data line DLj connected to the pixel circuit C of the defect pixel Pij is connected to the dummy data line DDL via the connection line GL, and thus, a data signal Dj applied to the pixel circuit C of the defect pixel Pij may also be applied to the dummy circuit DC of the dummy pixel DPi. The dummy circuit DC may generate a driving current Iij that corresponds to the data signal Dj, and may provide the light emitting device E of the defect pixel Pij with the driving current Iij through the repair line RLi. The light emitting device E of the defect pixel Pij may emit light of luminance corresponding to the data signal Dj via the driving current Iij. Accordingly, the defect pixel Pij may be repaired to a normal pixel.

In the present example embodiment, as the dummy data line DDL is connected to the data line DLj through the connection line GL, the dummy data line DDL is not needed to be driven additionally. Thus, there is no need to change another timing or a source driver in order to drive the dummy data line DDL, and a driving unit may be used without changing it.

Figure 4:
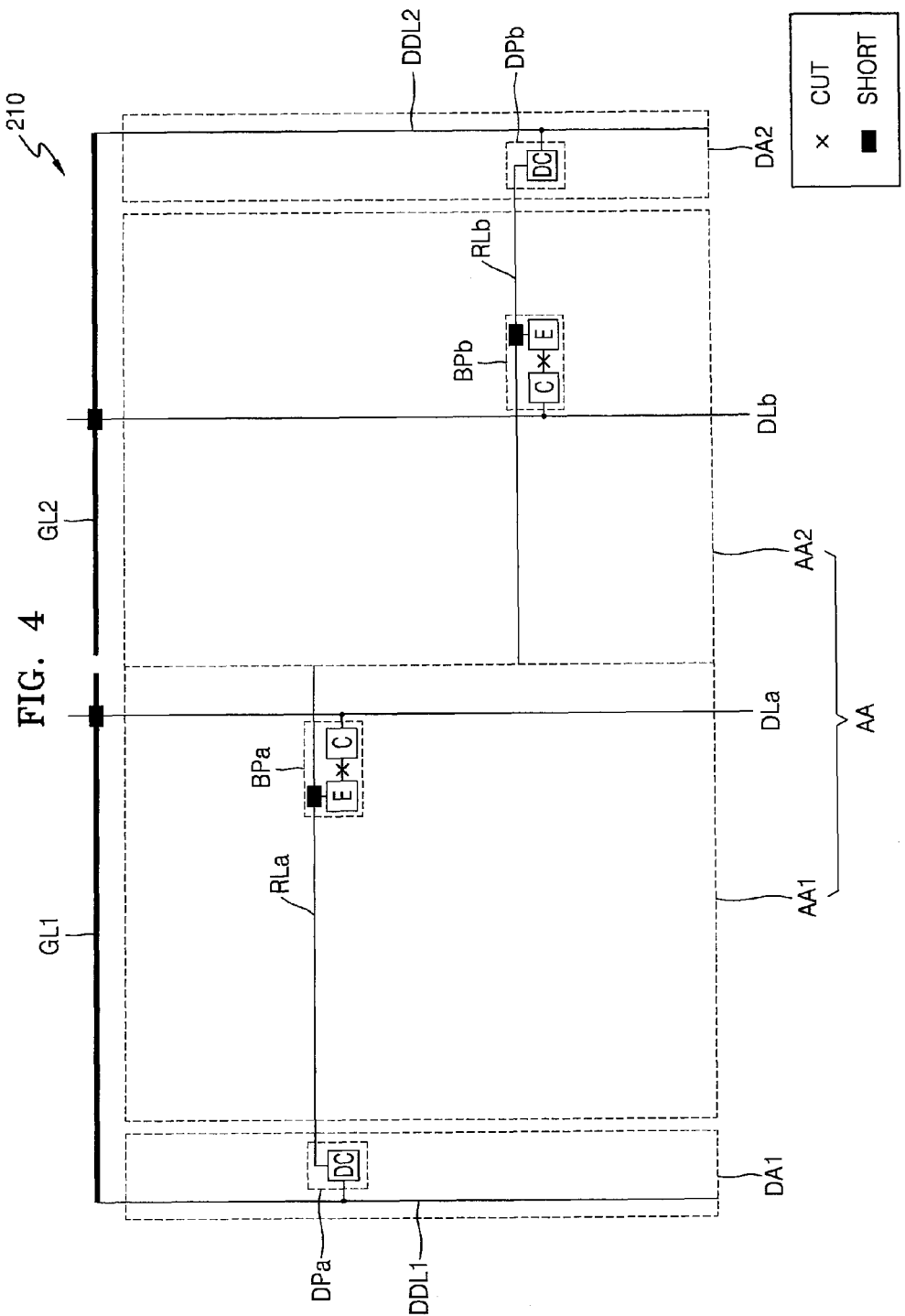
FIG. 4 schematically illustrates a display unit according to another example embodiment, which is similar to the display unit illustrated in FIG. 1.

FIG. 4 schematically illustrates a display unit 210 according to another example embodiment, which is similar to the display unit 110 illustrated in FIG. 1.

Referring to FIG. 4, the display unit 210 is substantially similar to the display unit 110 illustrated in FIG. 2 except for some differences. Here, descriptions of the same elements will be omitted, and the description will focus on the differences. Also, for easier understanding of the present example embodiment, in FIG. 4, normal pixels P are omitted, and only defect pixels BPa and BPb are illustrated, and control lines are also omitted.

The display unit 210 may include a first dummy area DA1 arranged on the left of an active area AA and a second dummy area DA2 arranged on the right of the active area AA. A first dummy data line DDL1 and a plurality of first dummy pixels (e.g., DPa) connected to the first dummy data line DDL1 may be arranged in the first dummy area DA1. A second dummy data line DDL2 and a plurality of second dummy pixels (e.g., Dpb) connected to the second dummy data line DDL2 may be arranged in the second dummy area DA2. The first dummy area DA1 and the second dummy area DA2 may correspond to the dummy area DA of FIG. 1.

The active area AA may be divided into a first active area AA1 and a second active area AA2. A first connection line GL1 connected to the first dummy data line DDL1 may be arranged above the first active area AA1, and a second connection line GL2 connected to the second dummy data line DDL2 may be arranged above the second active area AA2. The first connection line GL1 and the second connection line GL2 may be insulated from each other. The first connection line GL1 and the second connection line GL2 may also be arranged below the first active area AA1 and the second active area AA2. Data lines DLa above the first active area AA1 may be arranged to be connectable to the first connection line GL1. Data lines DLb above the second active area AA2 may be arranged to be connectable to the second connection line GL2.

The display unit 210 may include first repair lines (e.g., RLa) extending from the first dummy pixels DPa of the first dummy area DA1 to the first active area AA1 and second repair lines (e.g., RLb) extending from the second dummy pixels DPb of the second dummy area DA2 to the second active area AA2. The first repair lines RLa and the second repair lines RLb may be insulated from each other.

At least one defect pixel BPa in the first active area AA1 may be repaired by using the first repair lines RLa, the first connection lines GL1, and the first dummy data lines DDL1. A plurality of defect pixels BPa arranged on the same row may be repaired together without an additional connection line or an additional dummy data line. A light emitting device E of the defect pixel BPa of the first active area AA1 may be separated from the pixel circuit C, and may be connected to the dummy circuit DC of the first dummy pixel Dpa on the same row through the first repair line RLa. A data line DLa connected to the defect pixel BPa may be connected to the first connection line GL1, and a data signal applied to the data line DLa may also be applied to the dummy circuit DC. The dummy circuit DC may generate a driving current corresponding to the data signal, and the driving current may be provided to the light emitting device of the defect pixel Bpa through the first repair line RLa, and the light emitting device E may emit light based on the driving current.

At least one defect pixel BPb in the second active area AA2 may be repaired by using the second repair lines RLb, the second connection lines GL2, and the second dummy data lines DDL2. A light emitting device E of the defect pixel BPa of the second active area AA2 may be separated from the pixel circuit C, and may be connected to the dummy circuit DC of the second dummy pixel DP2 on the same row through the second repair line RLb. A data line DLb connected to the defect pixel BPa may be connected to the second connection line GL2, and a data signal applied to the data line DLb may also be applied to the dummy circuit DC. The dummy circuit DC may generate a driving current corresponding to the data signal, and the driving current may be provided to the light emitting device E of the defect pixel Bpb through the second repair line RLb, and the light emitting device E may emit light according based on the driving current.

According to the present example embodiment, at least one defect pixel BPb in the first active area AA1 and at least one defect pixel BPb in the second active area AA2 may be repaired. Moreover, according to the present example embodiment, even two defect pixels on the same row may be repaired.

In the above embodiments, a repair process in which a defect pixel and a dummy pixel DP on the same row are connected via a repair line on the same row is described. However, the example embodiments of the present invention are not limited thereto, and a repair process may also be applied when a defect pixel and a dummy pixel DP that are different rows are connected to each other through a repair line arranged on the same row as the defect pixel.

Figure 5:
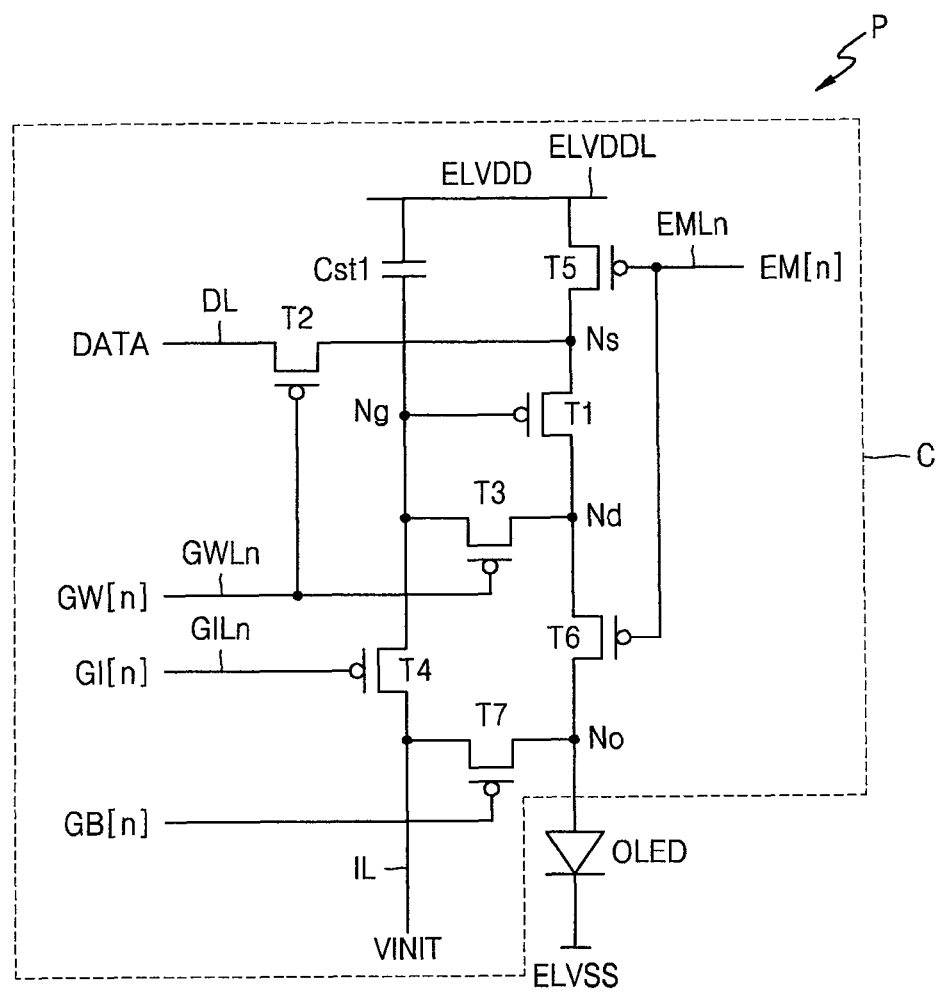
FIG. 5 is a circuit diagram illustrating a pixel according to an example embodiment of the present invention.

FIG. 5 is a circuit diagram illustrating a pixel P according to an example embodiment of the present invention.

The pixel P illustrated in FIG. 5 is one of pixels P included in an nth row, and may be connected to a scan line GWLn, a first initialization control line GILn, and an emission control line EMLn corresponding to the nth row to receive a scan signal GW[n], a first initialization control signal GI[n], and an emission control signal EM[n]. The pixel P may also receive a second initialization control signal GB[n] through a second initialization control line corresponding to the nth row.

The pixel P of a display apparatus according to the present example embodiment may include a pixel circuit C and an organic light emitting device OLED as a light emitting device E that is connected to the pixel circuit C and emits light. The organic light emitting device OLED may include a pixel electrode (anode), an opposite electrode (cathode), and an emission layer between the anode and the cathode.

The pixel circuit C may include a driving transistor T1, a switching transistor T2, a compensation transistor T3, an initialization transistor T4, an operation control transistor T5, an emission control transistor T6, a bypass transistor T7, and a storage capacitive element. The storage capacitive element may be a capacitor, and a storage capacitive element in the present specification may be referred to as a storage capacitor Cst1.

A gate electrode of the driving transistor T1 may be connected to a gate node Ng. A source electrode of the driving transistor T1 may pass through the operation control transistor T5 to be connected to a driving voltage line ELVDDL through a source node Ns. A drain electrode of the driving transistor T1 may pass through the emission control transistor T6 to be electrically connected to an anode of the organic light emitting device OLED through a drain node Nd. A current flowing to the organic light emitting device OLED is determined based on a voltage difference between the gate electrode and the source electrode of the driving transistor T1. A current amount flowing to the organic light emitting device OLED may determine a degree of emission of the organic light emitting device OLED.

A gate electrode of the switching transistor T2 may be connected to a scan line GLWn. A first electrode of the switching transistor T2 may be connected to a data line DL, and a second electrode of the switching transistor T2 may be connected to the source electrode of the driving transistor T1. The switching transistor T2 may be turned on according to a scan signal GW[n] transmitted through the scan line GWLn to transmit a data signal DATA transmitted to the data line DL, to the source electrode of the driving transistor T1, and the data signal DATA may be transmitted to the gate electrode of the driving transistor T1 via the compensation transistor T3 that is concurrently (e.g., simultaneously) turned on with the switching transistor T2.

A gate electrode of the compensation transistor T3 may be connected to the scan line GWLn. A first electrode of the compensation transistor T3 may be connected to the drain electrode of the driving transistor T1, and a second electrode of the compensation transistor T3 may be connected to the gate node Ng. The compensation transistor T3 may be turned on according to a scan signal GW[n] transmitted through the scan line GLWn to connect the gate electrode and the drain electrode of the driving transistor T1 to each other to thereby diode-connect the driving transistor T1 and compensate for a threshold voltage Vth of the driving transistor T1.

A gate electrode of the initialization transistor T4 may be connected to the first initialization control line GILn. A first electrode of the initialization transistor T4 may be connected to an initialization voltage line IL, and a second electrode of the initialization transistor T4 may be connected to the gate node Ng. The initialization transistor T4 may be turned on according to the first initialization control signal GI[n] applied from the first initialization control line GILn to transmit an initialization voltage VINIT to the gate Ng to thereby initialize the gate node Ng. The initialization voltage VINIT may be set to a second power voltage ELVSS or a voltage higher than the second power voltage ELVSS.

A gate electrode of the operation control transistor T5 may be connected to an emission control line ELMn. A first electrode of the operation control transistor T5 may be connected to the driving voltage line ELVDDL, and a second electrode of the operation control transistor T5 may be connected to the source electrode of the driving transistor T1.

A gate electrode of the emission control transistor T6 may be connected to the emission control line EMLn. A first electrode of the emission control transistor T6 may be connected to the drain electrode of the driving transistor T1, and a second electrode of the emission control transistor T6 may be electrically connected to an anode of the organic light emitting device OLED via an output node No. The operation control transistor T5 and the emission control transistor T6 may be concurrently (e.g., simultaneously) turned on according to an emission control signal EM[n] applied from the emission control line EMLn so that a first power voltage ELVDD is applied to the driving transistor T1 and that a driving current may flow to the organic light emitting device OLED.

A gate electrode of the bypass transistor T7 may be connected to a second initialization control line. A first electrode of the bypass transistor T7 may be connected to the anode of the organic light emitting device OLED via the output node No, and a second electrode of the bypass transistor T7 may be connected to an initialization voltage line IL. The bypass transistor T7 may be turned on by a second initialization signal GB[n] applied from a second initialization control line to initialize the anode of the organic light emitting device OLED. The second initialization control signal GB[n] may be the same as or different from the first initialization control signal GI[n].

The storage capacitor Cst1 may be connected between a driving voltage line ELVDDL and the gate node Ng. A voltage between the first power voltage ELVDD and the gate node Ng may be stored in the storage capacitor Cst1.

The anode of the organic light emitting device OLED is connectable to a repair line RLn and separable from the pixel circuit C. A cathode of the organic light emitting device OLED may be connected to a second power supply from which a second power voltage ELVSS is applied. The organic light emitting device OLED may receive a driving current from the driving transistor T1 to thereby emit light and display an image. The first power voltage ELVDD may be a high-level voltage (e.g., a predetermined high-level voltage), and the second power voltage ELVSS may be lower than the first power voltage ELVDD or a ground voltage.

Hereinafter, an operation of the pixel P will be described. In an initialization period, a low-level first initialization control signal GI[n] may be supplied to the initialization transistor T4 through the first initialization control line GILn, and a low-level second initialization control signal GB[n] may be supplied to the bypass transistor T7 through the second initialization control line. As a result, the initialization transistor T4 and the bypass transistor T7 may be respectively turned on. An initialization voltage VINIT supplied from the initialization voltage line IL may be transmitted to the gate electrode of the driving transistor T1 through the initialization transistor T4, and may be transmitted to the anode through the bypass transistor T7. Accordingly, voltages of the gate electrode of the driving transistor T1 and the anode may be initialized.

Hereinafter, in a data write period, a low-level scan signal GW[n] may be supplied through the scan line GWLn, and the switching transistor T2 and the compensation transistor T3 may be turned on. The switching transistor T2 may transmit a data signal DATA from the data line DL to the source electrode of the driving transistor T1, and the driving transistor T1 may be diode-connected via the compensation transistor T3. Then, a compensation voltage, obtained by reducing the data signal DATA by a threshold voltage of the driving transistor T1, may be applied to the gate electrode of the driving transistor T1.

A first power voltage ELVDD and a compensation voltage may be respectively applied to two ends of the storage capacitor Cst1, and a charge corresponding to a voltage difference between the two ends thereof may be stored in the storage capacitor Cst1.

Then, in an emission period, an emission control signal EM[n] supplied through the emission control line EMLn may be changed from a high level to a low level, and the operation control transistor T5 and the emission control transistor T6 may be turned on. Then, a driving current according to a difference between the gate electrode of the driving transistor T1 and the first power voltage ELVDD may be generated, and as the driving current is supplied to the organic light emitting device OLED through the emission control transistor T6, thereby emitting light.

Figure 6:
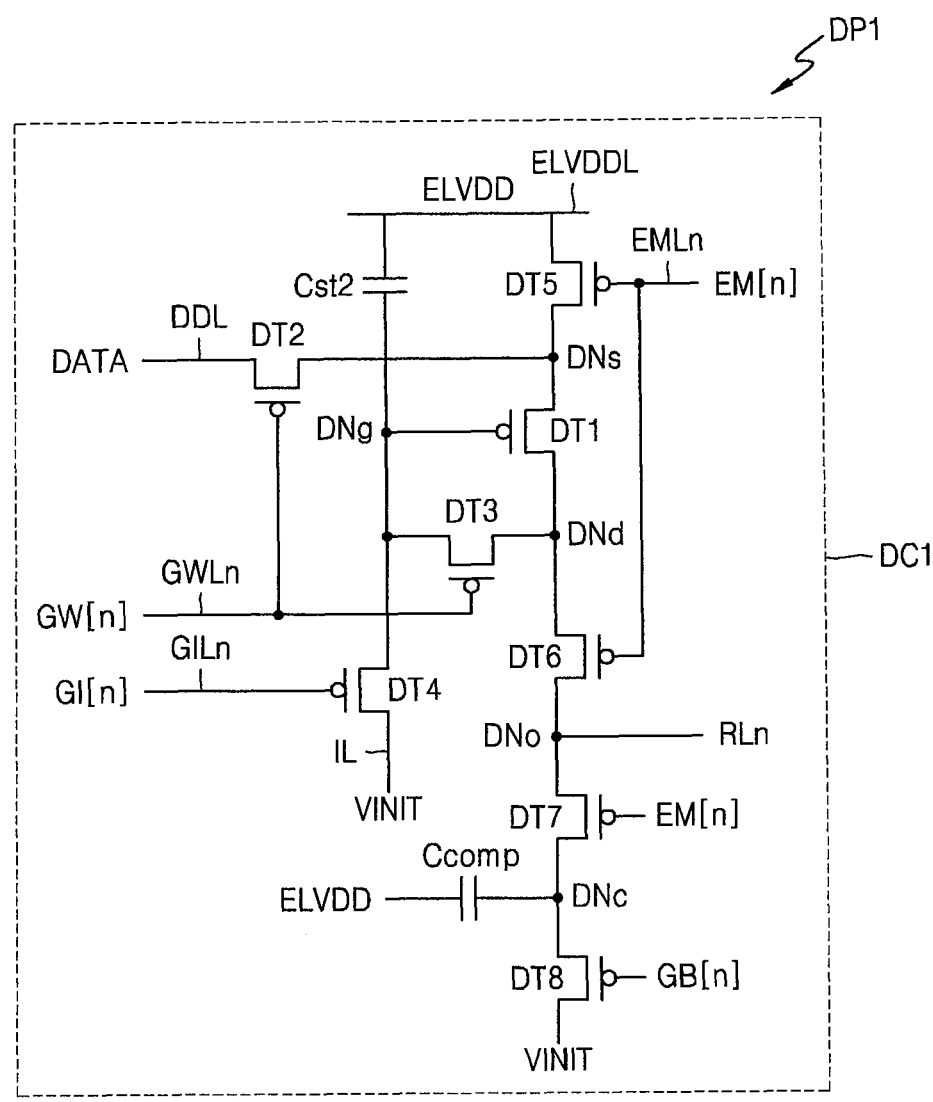
FIG. 6 is a circuit diagram illustrating a dummy pixel according to an example embodiment of the present invention.

FIG. 6 is a circuit diagram illustrating a dummy pixel DP1 according to an example embodiment of the present invention.

The dummy pixel DP1 illustrated in FIG. 6 may be a dummy pixel located on an nth row. The dummy pixel DP1 may be connected to a scan line GWLn, a first initialization control line GILn, and an emission control line EMLn corresponding to an nth row to receive an nth scan signal GW[n], an nth first initialization control signal GI[n], and an nth emission control signal EM[n], respectively.

The dummy pixel DP1 may include a dummy circuit DC1, and the dummy circuit DC1 may include a driving transistor DT1, a switching transistor DT2, a compensation transistor DT3, an initialization transistor DT4, an operation control transistor DT5, an emission control transistor DT6, a capacitance control transistor DT7, a capacitive element initialization transistor DT8, a storage capacitive element, and a compensation capacitive element. The storage capacitive element and the compensation capacitive element may be capacitors, and in the present specification, the storage capacitive element may be referred to as a storage capacitor Cst2, and the compensation capacitive element may be referred to as a compensation capacitor Ccomp. Elements of the dummy circuit DC1 may be different from those of the pixel circuit C in size and capacitance.

The dummy circuit DC1 of the dummy pixel DP1 is similar to or mostly the same as the pixel circuit C of the pixel P illustrated in FIG. 5 except for some differences. Thus, description of some of the same elements will be omitted, and description will focus on the differences.

A gate electrode of the capacitance control transistor DT7 may be connected to an emission control line EMLn to receive an emission control signal EM[n]. A first electrode of the capacitance control transistor DT7 may be connected to a repair line RLn through an output node DNo, and a second electrode of the capacitance control transistor DT7 may be connected to a compensation node DNc. The capacitance control transistor DT7 may be turned on according to the emission control signal EM[n] to supply energy stored in the compensation capacitor Ccomp, to the repair line RLn.

A gate electrode of the capacitive element initialization transistor DT8 may be connected to a second initialization control line to receive a second initialization control signal GB[n]. A first electrode of the capacitive element initialization transistor DT8 may be connected to the compensation node DNc, and a second electrode of the capacitive element initialization transistor DT8 may be connected to an initialization voltage line IL. The capacitive element initialization transistor DT8 may be turned on according to the second initialization control signal GB[n] to supply an initialization voltage VINIT to the compensation capacitor Ccomp so that a charge amount corresponding to a difference between the first power voltage ELVDD and the initialization voltage VINIT is stored in the compensation capacitor Ccomp.

The first power voltage ELVDD and a voltage of the compensation node DNc may be applied to two ends of the compensation capacitor Ccomp, and a charge corresponding to a voltage difference between the two ends thereof may be stored in the compensation capacitor Ccomp.

The dummy pixel DP1 may not include a light emitting device E. However, the dummy pixel DP1 may include a light emitting device according to design. When the dummy pixel DP1 includes a light emitting device, the light emitting device may not actually emit light but function as a circuit element. For example, the light emitting device may function as a capacitor included in a dummy pixel.

Hereinafter, an operation of the dummy pixel DP1 will be described. In an initialization period, a low-level first initialization control signal GI[n] may be supplied to the initialization transistor DT4 through the first initialization control line GILn, and a low-level second initialization control signal GB[n] may be supplied to the capacitive element initialization transistor DT8 through the second initialization control line. As a result, the initialization transistor DT4 and the capacitive element initialization transistor DT8 may be respectively turned on. The initialization voltage VINIT supplied from the initialization voltage line IL may be transmitted to a gate electrode of the driving transistor DT1 through the initialization transistor DT4, and may be transmitted to an anode through the capacitive element initialization transistor DT8. Accordingly, a voltage of the gate electrode of the driving transistor DT1 may be initialized, and a charge amount corresponding to a difference between the first power voltage ELVDD and the initialization voltage VINIT may be charged in the compensation capacitor Ccomp.

Thereafter, in a data write period, a low-level scan signal GW[n] may be supplied through the scan line GWLn, and the switching transistor DT2 and the compensation transistor DT3 may be turned on. The switching transistor TD2 may transmit a data signal DATA from a data line DL to a source electrode of the driving transistor DT1, and the driving transistor DT1 may be diode-connected via the compensation transistor DT3. Then a compensation voltage, obtained by reducing the data signal DATA by a threshold voltage of the driving transistor DT1, may be applied to the gate electrode of the driving transistor DT1.

A first power voltage ELVDD and a compensation voltage may be respectively applied to two ends of the storage capacitor Cst2, and a charge corresponding to a voltage difference between the two ends thereof may be stored in the storage capacitor Cst2.

Then, in an emission period, an emission control signal EM[n] supplied through the emission control line EMLn may be changed from a high level to a low level, and the operation control transistor DT5 and the emission control transistor DT6 may be turned on. Then, a driving current according to a difference between the gate electrode of the driving transistor DT1 and the first power voltage ELVDD may be generated, and the driving current is supplied to the organic light emitting device OLED through the emission control transistor DT6 along a repair line RLn. A current of a repair pixel supplied to the organic light emitting device OLED may be increased or decreased by energy stored in the compensation capacitor Ccomp. That is, when the emission control signal EM[n] is changed from a high level to a low level, the capacitance control transistor DT7 may be turned on, and energy due to a charge amount charged in the compensation capacitor Ccomp may be supplied to the output node DNo, and a variation in a potential of the output node Dno due to this energy supply may change a current amount supplied through the repair line RLn.

The pixels P formed in the active area AA may have different electrical characteristics according to pixel types. For example, it may be assumed that the pixels P include first and second pixels. In the first pixels, a gate node Ng of each pixel and an anode of an organic light emitting device OLED may be at a physically far distance from each other so that no capacitance or a relatively small capacitance is generated between the gate node Ng and the anode, and in the second pixels, a gate node Ng of each pixel and an anode of an organic light emitting device OLED may be at a physically close distance from each other so that a relatively great capacitance is generated between the gate node Ng and the anode. In this case, if one of the first pixels is a repair pixel, a driving current supplied through a pixel circuit C of the repair pixel may be almost the same as a driving current supplied through a dummy circuit DC after a repair process. However, if one of the second pixels is a repair pixel, a driving current supplied through a pixel circuit C of the repair pixel may be different from a driving current supplied through a dummy circuit DC after a repair process. Thus, if a repair process is performed on a pixel included in the second pixels, a bright defect may be caused in a high-grayscale image.

Figure 7:
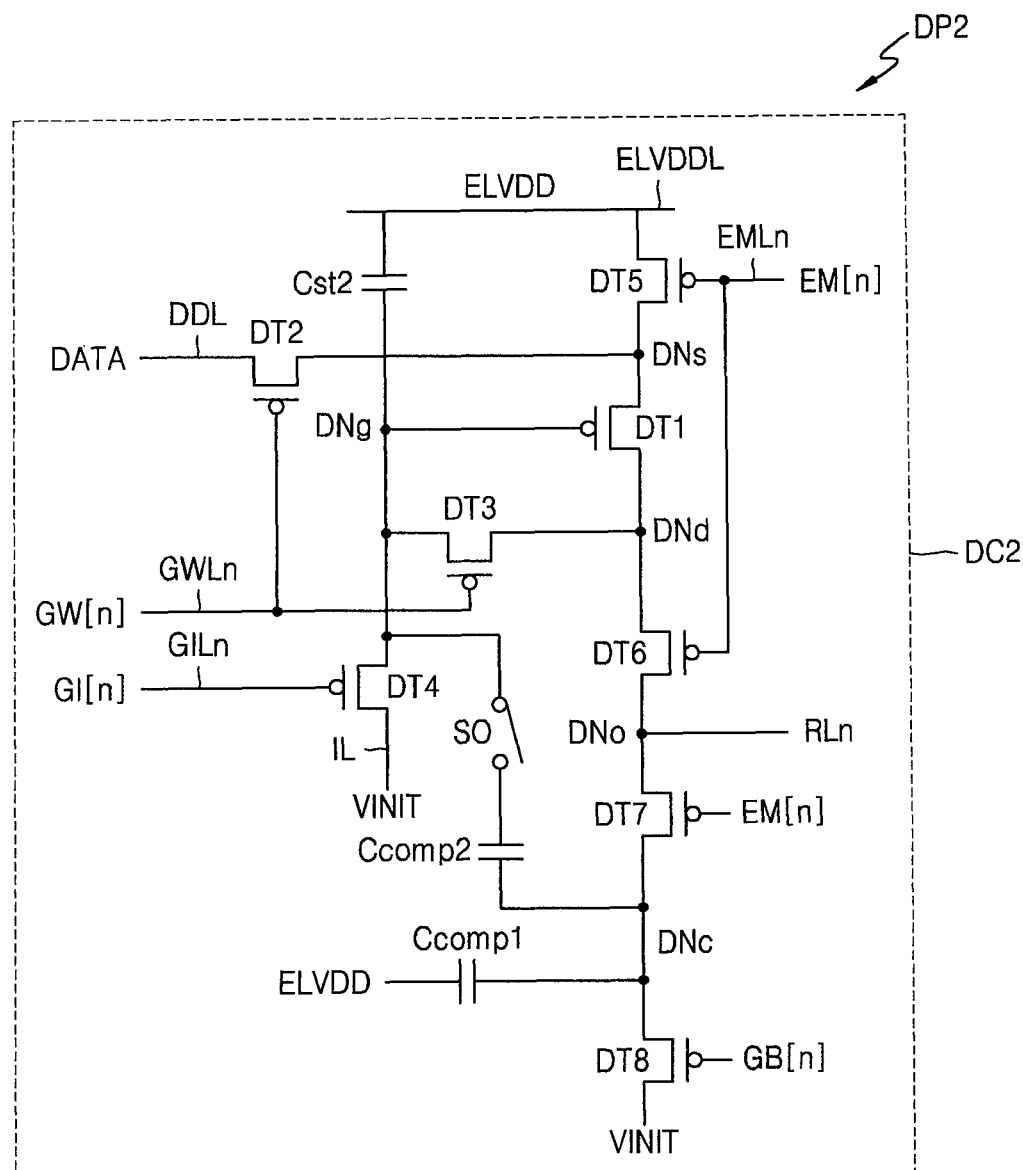
FIG. 7 is a circuit diagram illustrating a dummy pixel according to another example embodiment of the present invention.

FIG. 7 is a circuit diagram illustrating a dummy circuit DC2 according to another example embodiment of the present invention.

The dummy circuit DC2 of a dummy pixel DP2 illustrated in FIG. 7 is mostly the same as the dummy circuit DC1 of the dummy pixel DP1 illustrated in FIG. 6 except for some differences. Thus, description of the same elements will be omitted, and description will focus on the differences.

The dummy circuit DC2 may include a driving transistor DT1, a switching transistor DT2, a compensation transistor DT3, an initialization transistor DT4, an operation control transistor DT5, an emission control transistor DT6, a capacitance control transistor DT7, a capacitive element initialization transistor DT8, a storage capacitive element, a second compensation capacitive element, and a connection portion.

The storage capacitive element and the second compensation capacitive element may be capacitors, and in the present specification, the storage capacitive element may be referred to as a storage capacitor Cst2, and the second compensation capacitive element may be referred to as a second compensation capacitor Ccomp2. The second compensation capacitor Ccomp2 and the connection portion may be serially connected between a gate node DNg and a compensation node DNc. For example, a first electrode of the connection portion may be connected to the gate node DNg, and a second electrode of the connection portion may be connected to a first electrode of the second compensation capacitor Ccomp2, and a second electrode of the second compensation capacitor Ccomp2 may be connected to the compensation node DNc. In this case, capacitance of the second compensation capacitor Ccomp2 may correspond to capacitance generated between the gate node Ng of the pixels P formed in the active area AA and the anode of the organic light emitting device OLED.

The dummy circuit DC2 may include a first compensation capacitive element. The first compensation capacitive element may be capacitors, and the first compensation capacitive element may be referred to as a first compensation capacitor Ccomp1 in the present specification. A first power voltage ELVDD and a voltage of the compensation node DNc may be respectively applied to two ends of the first compensation capacitor Ccomp1, and a charge corresponding to a voltage difference between the two ends thereof may be stored in the first compensation capacitor Ccomp1.

The connection portion may be used to electrically connect or separate the first electrode of the second compensation capacitor Ccomp2 and the gate node DNg to or from each other based on a physical quantity applied to the connection portion. For example, the connection portion may be a connection element SO in which a first electrode and a second electrode thereof are electrically separated from each other, and when a physical quantity is applied to the first and second electrodes by using a laser or the like, the first and second electrodes are connected to each other.

Hereinafter, an operation of the dummy pixel DP2 will be described. In an initialization period, a low-level first initialization control signal GI[n] may be supplied to the initialization transistor DT4 through the first initialization control line GILn, and a low-level second initialization control signal GB[n] may be supplied to the capacitive element initialization transistor DT8 through a second initialization control line. As a result, the initialization transistor DT4 and the capacitive element initialization transistor DT8 may be respectively turned on. An initialization voltage VINIT supplied from the initialization voltage line IL may be transmitted to a gate electrode of the driving transistor DT1 through the initialization transistor DT4, and may be transmitted to the anode through the capacitive element initialization transistor DT8. Accordingly, the gate electrode of the driving transistor DT1 may be initialized, and a charge amount corresponding to a difference between the first power voltage ELVDD and the initialization voltage VINIt may be charged in the first compensation capacitor Ccomp1.

Hereinafter, in a data write period, a low-level scan signal GW[n] may be supplied through the scan line GWLn, and the switching transistor DT2 and the compensation transistor DT3 may be turned on. The switching transistor DT2 may transmit a data signal DATA from a data line DL to a source electrode of the driving transistor DT1, and the driving transistor DT1 may be diode-connected via the compensation transistor DT3. Then a compensation voltage, obtained by reducing the data signal DATA by a threshold voltage of the driving transistor DT1, may be applied to the gate electrode of the driving transistor DT1.

A first power voltage ELVDD and a compensation voltage may be respectively applied to two ends of the storage capacitor Cst2, and a charge corresponding to a voltage difference between the two ends thereof may be stored in the storage capacitor Cst2.

Then, in an emission period, an emission control signal EM[n] supplied through the emission control line EMLn may be changed from a high level to a low level, and the operation control transistor DT5 and the emission control transistor DT6 may be turned on. Then, a driving current according to a difference between the gate electrode of the driving transistor DT1 and the first power voltage ELVDD may be generated, and the driving current is supplied to an organic light emitting device OLED of a repair pixel through the emission control transistor DT6 along a repair line RLn.

A current supplied to the organic light emitting device OLED of the repair pixel may be increased or decreased by energy stored in the first compensation capacitor Ccomp1. That is, when the emission control signal EM[n] is changed from a high level to a low level, the capacitance control transistor DT7 may be turned on, and energy due to a charge amount charged in the first compensation capacitor Ccomp1 may be supplied to an output node DNo, and a variation in a potential of the output node Dno due to this energy supply may change a current amount supplied through the repair line RLn.

Also, a current supplied to the organic light emitting device OLED of the repair pixel may be increased or decreased by energy charged in the second compensation capacitor Ccomp2 based on a state of the connection element SO. If no particular physical amount is applied to the connection element SO and thus first and second electrodes of the connection element SO are electrically separated from each other, the second compensation capacitor Ccomp2 may not affect a current amount supplied through the repair line RLn.

Additionally, when a laser is applied to the first and second electrodes of the connection element SO to electrically connect the first and second electrodes of the connection element SO, energy due to a charge amount charged in the second compensation capacitor Ccomp2 may be supplied to the output node DNo when the capacitance control transistor DT7 is turned on, and the current amount supplied through the repair line RLn may be changed due to a variation in a potential of the output node DNo due to this energy supply.

A current amount flowing to the organic light emitting device OLED of the repair pixel after a repair process may be adjusted by changing a shape of the connection portion or a repair signal by using the dummy circuit DC2 illustrated in FIG. 7.

For example, it may be assumed that the pixels P include first and second pixels. In the first pixels, a gate node Ng of each pixel and an anode of an organic light emitting device OLED may be at a physically far distance from each other so that no capacitance or a relatively small capacitance is generated between the gate node Ng and the anode, and in the second pixels, a gate node Ng of each pixel and an anode of an organic light emitting device OLED may be at a physically close distance from each other so that a relatively great capacitance is generated between the gate node Ng and the anode.

If one of the first pixels is a repair pixel, the dummy circuit DC2 may be configured such that the first and second electrodes of the connection element SO are opened. Also, if one of the second pixels is a repair pixel, the dummy circuit DC2 may be configured such that the first and second electrodes of the connection element SO are shorted. As a result, regardless of to which pixel among the first and second pixels a repair process is applied, a driving current supplied through a pixel circuit C of a corresponding pixel may be almost the same as a driving current supplied through the dummy circuit DC2 after a repair process.

Figure 8:
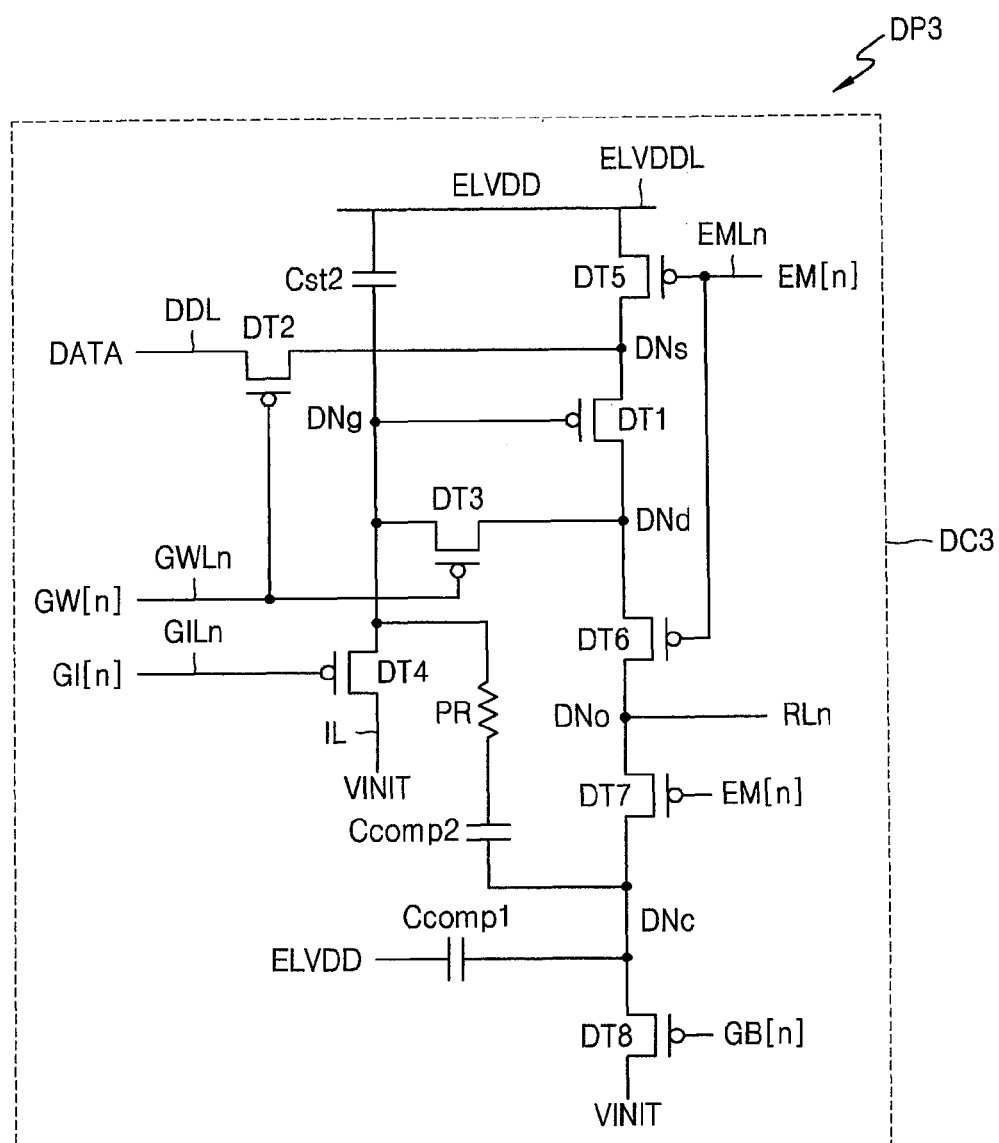
FIG. 8 is a circuit diagram illustrating a dummy pixel according to another example embodiment of the present invention.

FIG. 8 is a circuit diagram illustrating a dummy circuit DC3 according to another example embodiment of the present invention.

The dummy circuit DC3 of a dummy pixel DP3 illustrated in FIG. 8 is similar to or mostly the same as the dummy circuit DC2 of the dummy pixel DP2 illustrated in FIG. 7 except for some differences. Thus, description of the same elements will be omitted, and description will focus on the differences.

The dummy circuit DC3 may include a driving transistor DT1, a switching transistor DT2, a compensation transistor DT3, an initialization transistor DT4, an operation control transistor DT5, an emission control transistor DT6, a capacitance control transistor DT7, a capacitive element initialization transistor DT8, a storage capacitive element, a first compensation capacitive element, a second compensation capacitive element, and a connection portion.

The storage capacitive element, the first compensation capacitive element, and the second compensation capacitive element may be capacitors, and in the present specification, the storage capacitive element may be referred to as a storage capacitor Cst2, and the first compensation capacitive element may be referred to as a first compensation capacitor Ccomp1, and the second compensation capacitive element may be referred to as a second compensation capacitor Ccomp2. In this case, capacitance of the second compensation capacitor Ccomp2 may correspond to capacitance generated between the gate node Ng of the pixels P formed in the active area AA and the anode of the organic light emitting device OLED.

The connection portion may be used to electrically connect or separate a first electrode of the second compensation capacitor Ccomp2 and a gate node DNg to or from each other based on a physical amount applied to the connection portion. For example, the connection portion may be a connection element SO, in which a first electrode and a second electrode thereof are electrically connected to each other, and when a physical quantity is applied to the first and second electrodes by using a laser or the like, the first and second electrodes are separated from each other. For example, the connection portion may be a polysilicon resistor PR. In this case, if no particular physical quantity is applied, a first electrode and a second electrode which are two ends of the polysilicon resistor PR are electrically connected to each other. However, by heating the polysilicon resistor PR using laser, the polysilicon resistor PR may be cut to electrically separate the first and second electrode of the polysilicon resistor PR from each other.

Operations of the dummy pixel DP3 of FIG. 8 before an emission control signal EM[n] supplied through the emission control line EMLn is changed from a high level to a low level are the same as in the operation of the dummy pixel DP2 of FIG. 7, and thus, operations thereafter will be described herein. In an emission period, an emission control signal EM[n] supplied through the emission control line EMLn may be changed from a high level to a low level, and the operation control transistor DT5 and the emission control transistor DT6 may be turned on. Then, a driving current according to a difference between a voltage of the gate electrode of the driving transistor DT1 and the first power voltage ELVDD may be generated, and the driving current is supplied to an organic light emitting device OLED of a repair pixel through the emission control transistor DT6 along a repair line RLn.

A current supplied to the organic light emitting device OLED of the repair pixel may be increased or decreased by energy stored in the first compensation capacitor Ccomp1. That is, when the emission control signal EM[n] is changed from a high level to a low level, the capacitance control transistor DT7 may be turned on, and energy due to a charge amount charged in the first compensation capacitor Ccomp1 may be supplied to an output node DNo, and a variation in a potential of the output node Dno due to this energy supply may change a current amount supplied through the repair line RLn.

Also, a current supplied to the organic light emitting device OLED of the repair pixel may be increased or decreased by energy charged in the second compensation capacitor Ccomp2 based on a connection state of the polysilicon resistor PR. If no particular physical quantity is applied to the polysilicon resistor PR and thus first and second electrodes of the polysilicon resistor PR are electrically connected to each other, a charge amount charged in the second compensation capacitor Ccomp2 may be supplied to the output node DNo when the capacitance control transistor DT7 is turned on, and a current amount supplied through the repair line RLn may be changed due to a variation in a potential of the output node DNo due to this energy supply. On the other hand, if a laser is irradiated to the first and second electrodes of the polysilicon resistor PR to electrically separate the first and second electrodes of the polysilicon resistor PR, the second compensation capacitor Ccomp2 may not affect a current amount supplied through the repair line RLn.

A current amount flowing to the organic light emitting device OLED of the repair pixel after a repair process may be adjusted by changing a shape of the connection portion or a repair signal by using the dummy circuit DC3 illustrated in FIG. 8. For example, it may be assumed that the pixels P include first and second pixels. In the first pixels, a gate node Ng of each pixel and an anode of an organic light emitting device OLED may be at a physically far distance from each other so that no capacitance or a relatively small capacitance is generated between the gate node Ng and the anode, and in the second pixels, a gate node Ng of each pixel and an anode of an organic light emitting device OLED may be at a physically close distance from each other so that a relatively great capacitance is generated between the gate node Ng and the anode. If one of the first pixels is a repair pixel, the dummy circuit DC3 may be configured such that the first and second electrodes of the polysilicon resistor PR are opened. Also, if one of the second pixels is a repair pixel, the dummy circuit DC3 may be configured such that the first and second electrodes of the polysilicon resistor PR are shorted. As a result, regardless of to which pixel among the first and second pixels a repair process is applied, a driving current supplied through a pixel circuit C of a corresponding pixel may be almost the same as a driving current supplied through the dummy circuit DC3 after a repair process.

Figure 9:
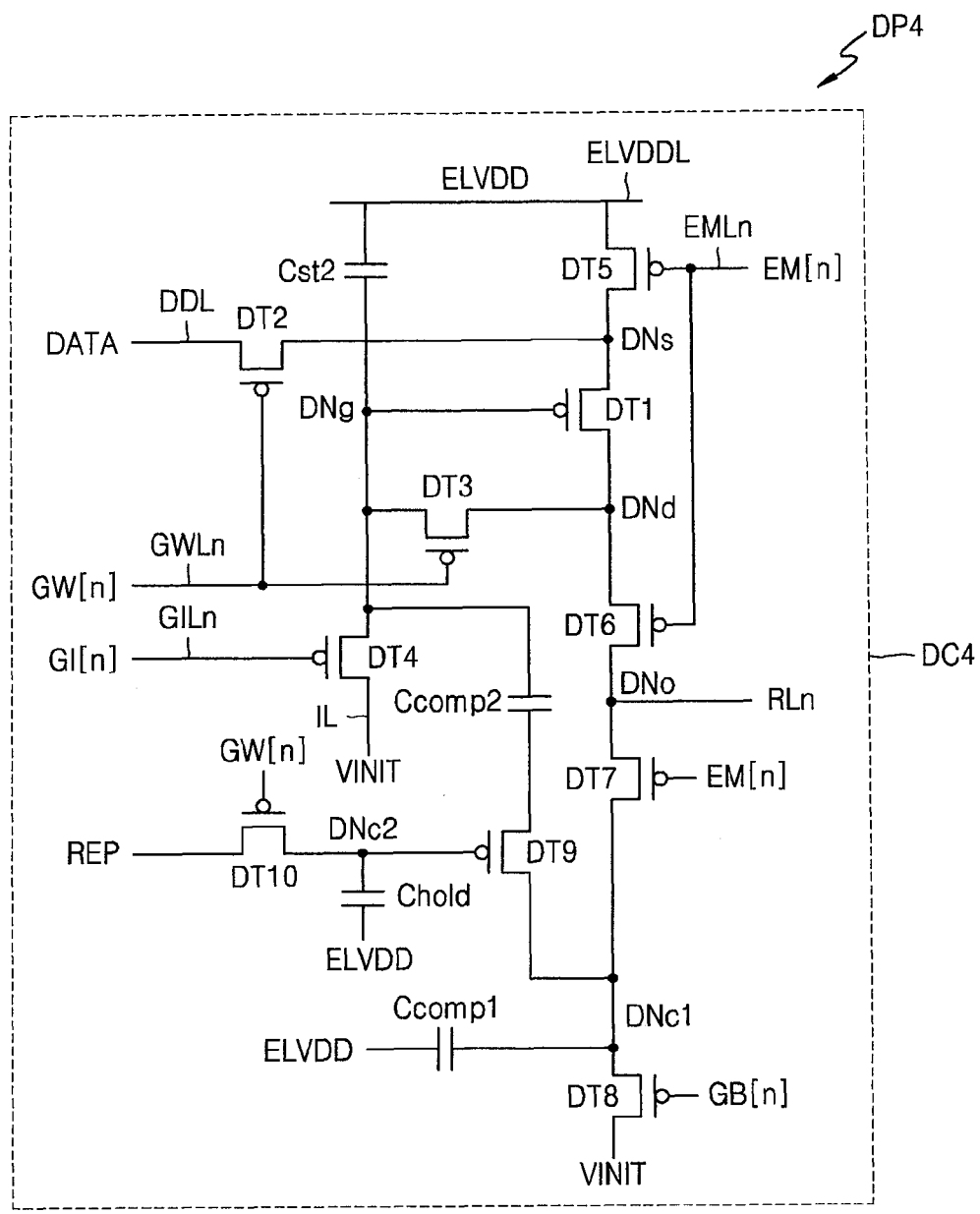
FIG. 9 is a circuit diagram illustrating a dummy pixel according to another example embodiment of the present invention.

FIG. 9 is a circuit diagram illustrating a dummy circuit DC4 according to another example embodiment of the present invention.

The dummy circuit DC4 of a dummy pixel DP4 illustrated in FIG. 9 is mostly the same as the dummy circuit DC2 of the dummy pixel DP2 illustrated in FIG. 7 except for some differences. Thus, description of the same elements will be omitted, and description will focus on the differences.

The dummy circuit DC4 may include a driving transistor DT1, a switching transistor DT2, a compensation transistor DT3, an initialization transistor DT4, an operation control transistor DT5, an emission control transistor DT6, a first capacitance control transistor DT7, a capacitive element initialization transistor DT8, a second capacitance control transistor DT9, a third capacitance control transistor DT10, a storage capacitive element, a first compensation capacitive element, a second compensation capacitive element, and a holding capacitive element. The storage capacitive element, the first compensation capacitive element, and the second compensation capacitive element may be capacitors, and in the present specification, the storage capacitive element may be referred to as a storage capacitor Cst2, and the first compensation capacitive element may be referred to as a first compensation capacitor Ccomp1, and the second compensation capacitive element may be referred to as a second compensation capacitor Ccomp2, and the holding capacitive element may be referred to as a holding capacitor Chold. In this case, capacitance of the second compensation capacitor Ccomp2 may correspond to capacitance generated between the gate node Ng of the pixels P formed in the active area AA and the anode of the organic light emitting device OLED.

The second compensation capacitor Ccomp2 and the second capacitance control transistor DT9 may be serially connected between a gate node DNg and a first compensation node DNc1. For example, a first electrode of the second compensation capacitor Ccomp2 may be connected to the gate node DNg, and a second electrode of the second compensation capacitor Ccomp2 may be connected to a first electrode of the second capacitance control transistor DT9, and a second electrode of the second capacitance control transistor DT9 may be connected to the first compensation node DNc1. A gate electrode of the second capacitance control transistor DT9 may receive a voltage of a second compensation node DNc2.

A gate electrode of the third capacitance control transistor DT10 may be connected to a scan line GWLn to receive a scan signal GW[n]. A first electrode of the third capacitance control transistor DT10 may be connected to a line through which a repair signal REP is supplied, and a second electrode of the third capacitance control transistor DT10 may be connected to the second compensation node DNc2.

A first power voltage ELVDD and a voltage of the second compensation node DNc2 may be respectively applied to two ends of the holding capacitor Chold, and a charge corresponding to a voltage difference between the two ends thereof may be stored in the holding capacitor Chold.

Operations of the dummy pixel DP4 of FIG. 9 before an emission control signal EM[n] supplied through the emission control line EMLn is changed from a high level to a low level are the same as in the operation of the dummy pixel DP2 of FIG. 7, and thus, operations thereafter will be described herein. In an emission period, an emission control signal EM[n] supplied through the emission control line EMLn may be changed from a high level to a low level, and the operation control transistor DT5 and the emission control transistor DT6 may be turned on.

Then, a driving current according to a voltage difference between a voltage of the gate electrode of the driving transistor DT1 and the first power voltage ELVDD may be generated, and the driving current may be supplied to an organic light emitting device OLED of a repair pixel through the emission control transistor DT6 along a repair line RLn. A current supplied to the organic light emitting device OLED of the repair pixel may be increased or decreased by energy stored in the first compensation capacitor Ccomp1.

That is, when the emission control signal EM[n] is changed from a high level to a low level, the first capacitance control transistor DT7 may be turned on, and energy due to a charge amount charged in the first compensation capacitor Ccomp1 may be supplied to an output node DNo, and a variation in a potential of the output node Dno due to this energy supply may change a current amount supplied through the repair line RLn. Also, a current supplied to the organic light emitting device OLED of the repair pixel may be increased or decreased by energy charged in the second compensation capacitor Ccomp2 based on a state of the second capacitance control transistor DT9.

That is, if a voltage of the second compensation node DNc2 is a high level, a high-level voltage may be supplied to a gate electrode of the second capacitance control transistor DT9, and the second capacitance control transistor DT9 may not affect a current amount supplied through the repair line RLn.

Additionally, if a voltage of the second compensation node DNc2 is a low level, a low-level voltage may be supplied to the gate electrode of the second capacitance control transistor DT9, and the second capacitance control transistor DT9 may be turned on. As a result, energy due to a charge amount charged in the second compensation capacitor Ccomp2 may be supplied to the output node DNo, and a current amount supplied through the repair line RLn may be changed due to a variation in a potential of the output node DNo due to this energy supply. A level of a voltage of the second compensation node DNc2 that affects turning on of the second capacitance control transistor DT9 may be determined based on a repair signal REP.

A current amount flowing to the organic light emitting device OLED of the repair pixel after a repair process may be adjusted by changing a shape of the connection portion or a repair signal by using the dummy circuit DC4 illustrated in FIG. 9. For example, it may be assumed that the pixels P include first and second pixels. In the first pixels, a gate node Ng of each pixel and an anode of an organic light emitting device OLED may be at a physically far distance from each other so that no capacitance or a relatively small capacitance is generated between the gate node Ng and the anode, and in the second pixels, a gate node Ng of each pixel and an anode of an organic light emitting device OLED may be at a physically close distance from each other so that a relatively great capacitance is generated between the gate node Ng and the anode.

If one of the first pixels is a repair pixel, a repair signal REP may be set to a high-level signal, and accordingly, the repair signal REP may be set such that the second capacitance control transistor DT9 is always turned off. Also, if one of the second pixels is a repair pixel, a repair signal REP may be set to have a low level every time when image data corresponding to a repair pixel is output so that the second capacitance control transistor DT9 is turned on every corresponding moment. As a result, regardless of to which pixel among the first and second pixels a repair process is applied, a driving current supplied through a pixel circuit C of a corresponding pixel may be almost the same as a driving current supplied through the dummy circuit DC4 after a repair process.

Figure 10:
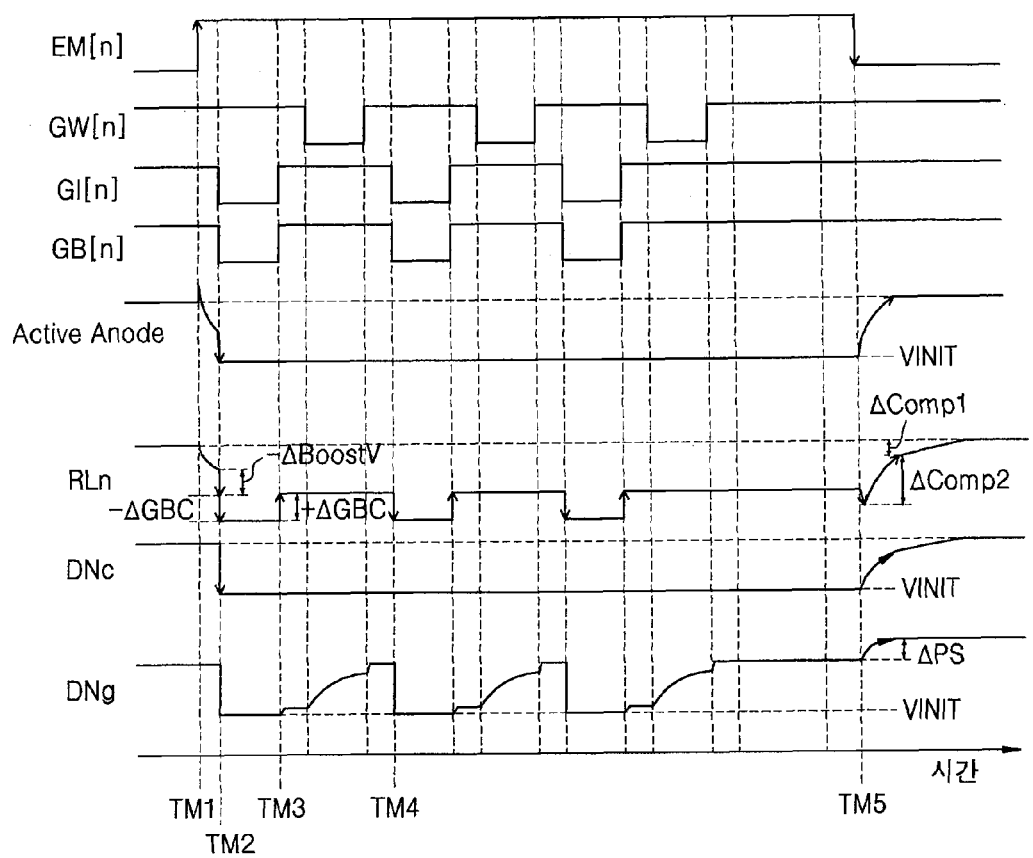
FIG. 10 is a timing diagram illustrating an operation of a dummy pixel according to another example embodiment of the present invention.

FIG. 10 is a timing diagram illustrating an operation of the dummy pixels according to the example embodiments of FIGS. 7 through 9.

Referring to FIG. 10, between a first time TM1 when an emission control signal EM[n] is transitioned from a low level to a high level and a fifth time TM5 when an emission control signal EM[n] is transitioned from a high level to a low level, a scan signal EM[n], a first initialization control signal GI[n], and a second initialization control signal GB[n] may be transitioned several times, and voltage levels of the anode (active anode) of the repair pixel, the output node DNo, the compensation node DNc, and the gate node DNg, to which the repair line RLn is connected, may be changed.

First, in the first time TM1, the emission control signal EM[n] is transitioned from a low level to a high level so as to start a period in which the organic light emitting device OLED does not emit light.

Next, in a second time TM2, the first initialization control signal GI[n] and the second initialization control signal GB[n] are transitioned from a high level to a low level so as to initialize the gate electrode of the driving transistor DT1 and the compensation node DNc to an initialization voltage VINIT. Next, in a third time TM3, the first initialization control signal GI[n] and the second initialization control signal GB[n] may be transitioned from a low level to a high level. Changes of the first initialization control signal GI[n] and the second initialization control signal GB[n] as in the second time TM2 and the third time TM3 may be repeated several times.

For example, transition of the first initialization control signal GI[n] and the second initialization control signal GB[n] from a high level to a low level as in the second time TM2 may also occur in a fourth time TM4. Here, a coupling effect due to a drop in a voltage level of the anode (active anode) of the repair pixel may cause a drop (−ΔBoostV) of a voltage level of the repair line RLn. Also, when the second initialization control signal GB[n] is transitioned from a high level to a low level, a coupling effect due to a drop of a voltage level of the second initialization control line may cause a drop (−ΔGBC) of a voltage level of the repair line, and when the second initialization control signal GB[n] is transitioned from a low level to a high level, a coupling effect due to a rise in a voltage level of the second initialization control line may cause a rise (ΔGBC) of a voltage level of the repair line RLn.

Next, in the fifth time TM5, the emission control signal EM[n] may be transitioned from a high level to a low level, and an emission period may start. Here, a potential of the anode (active anode) of the repair pixel may be increased by a voltage corresponding to a data voltage. Energy due to a charge amount charged in the first compensation capacitor Ccomp1 may be supplied to the output node DNo, and accordingly, a rise (ΔComp1) of a voltage level of the repair line RLn may be generated. Also, when the first electrode of the second compensation capacitor Ccomp2 and the gate electrode of the driving transistor DT1 are electrically connected to each other, energy due to a charge amount charged in the second compensation capacitor Ccomp2 may be supplied to the output node DNo, and accordingly a rise (ΔComp2) of a voltage level of the repair line RLn may be generated.

Accordingly, a current amount output through the repair line RLn may be adjusted based on a circuit structure of the repair pixel to which a repair process is applied. For example, it may be assumed that the pixel P includes first and second pixels, and in the first pixels, a gate node Ng of each pixel and an anode of an organic light emitting device OLED may be at a physically far distance from each other so that no capacitance or a relatively small capacitance is generated between the gate node Ng and the anode, and in the second pixels, a gate node Ng of each pixel and an anode of an organic light emitting device OLED may be at a physically close distance from each other so that a relatively great capacitance is generated between the gate node Ng and the anode.

If one of the first pixels is a repair pixel, the dummy circuits may be set such that the first electrode of the second compensation capacitor Ccomp2 and the gate electrode of the driving transistor DT1 are electrically separated from each other, and thus the second compensation capacitor Ccomp2 may not affect a voltage level of the repair line RLn. Also, if one of the second pixels is a repair pixel, the dummy circuits may be set such that the first electrode of the second compensation capacitor Ccomp2 and the gate electrode of the driving transistor DT1 are electrically connected to each other, and accordingly, energy due to a charge amount charged in the second compensation capacitor Ccomp2 is supplied to the output node DNo so as to generate a rise (ΔComp2) in a voltage level of the repair line RLn.

As a result, assuming that image data is identical, the organic light emitting display apparatus 100, in which the dummy pixel DP according to the example embodiments of the present invention is arranged, may maintain an amount of current output to the organic light emitting device OLED in any of cases when a repair process is not applied, when a repair process is applied to one of the first pixels, or when a repair process is applied to one of the second pixels.

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein.

Finally, the steps of all methods described herein can be performed in any suitable order unless otherwise indicated herein or otherwise clearly contradicted by context. The use of any and all examples, or example language (e.g., "such as") provided herein, is intended merely to better illuminate the invention and does not pose a limitation on the scope of the invention unless otherwise claimed. Numerous modifications and adaptations will be readily apparent to those skilled in this art without departing from the spirit and scope of the present invention.

It should be understood that the example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. An organic light emitting display apparatus comprising:
   a plurality of pixels at a display area;
   a plurality of dummy pixels at a dummy area; and
   a plurality of repair lines that are connected to the plurality of dummy pixels and connectable to the plurality of pixels,
   wherein each of the plurality of dummy pixels comprises:
   a compensation capacitive element;
   a driving transistor configured to output a driving current corresponding to a data signal applied to a gate electrode of the driving transistor; and
   a connection portion between a first electrode of the compensation capacitive element and the gate electrode of the driving transistor, and that is configured to electrically connect or separate the first electrode of the compensation capacitive element and the gate electrode of the driving transistor to or from each other based on a physical quantity applied to the connection portion.

2. The organic light emitting display apparatus of claim 1, wherein each of the plurality of dummy pixels further comprises:
   an emission control transistor between an output node connected to a corresponding repair line among the plurality of repair lines and the driving transistor and that is controlled according to an emission control signal;
   a capacitance control transistor between the output node and a second electrode of the compensation capacitive element and is controlled according to the emission control signal; and
   a capacitive element initialization transistor between the capacitance control transistor and an initialization voltage line and is controlled according to an initialization control signal.

3. The organic light emitting display apparatus of claim 1, wherein the connection portion comprises:
   a first area connected to the first electrode of the compensation capacitive element; and
   a second area connected to the gate electrode of the driving transistor,
   wherein the first and second areas are electrically separated from each other, and are electrically connectable to each other by using a laser.

4. The organic light emitting display apparatus of claim 1, wherein the connection portion comprises:
   a first area connected to the first electrode of the compensation capacitive element; and
   a second area connected to the gate electrode of the driving transistor,
   wherein the first and second areas are electrically connected to each other, and are electrically separable from each other by using a laser.

5. The organic light emitting display apparatus of claim 1, wherein each of the plurality of pixels comprises a pixel circuit and a light emitting device that is separably connected to the pixel circuit, and
   each of the plurality of dummy pixels comprises a dummy circuit.

6. The organic light emitting display apparatus of claim 5, wherein one of the plurality of pixels comprises a repair pixel, and
   the repair pixel comprises a light emitting device that is separated from a pixel circuit of the repair pixel and is connected to a dummy circuit of a corresponding dummy pixel among the plurality of dummy pixels through a corresponding repair line among the plurality of repair lines.

7. The organic light emitting display apparatus of claim 6, wherein the plurality of pixels comprise a first pixel and a second pixel, and
   the connection portion comprises:
   an emission control transistor between an output node connected to a corresponding repair line among the plurality of repair lines and the driving transistor and is controlled according to an emission control signal;
   a first capacitance control transistor between the output node and a compensation control node and is controlled according to the emission control signal;
   a capacitive element initialization transistor between the compensation control node and an initialization voltage line and is controlled according to an initialization signal; and
   a second capacitance control transistor between the compensation control node and a second electrode of the compensation capacitive element, and that electrically connects the compensation control node and the second electrode of the compensation capacitive element if the repair pixel is the first pixel, and that electrically separates the compensation control node and the second electrode of the compensation capacitive element if the repair pixel is the second pixel.

8. The organic light emitting display apparatus of claim 6, wherein the dummy circuit of the corresponding dummy pixel is configured to provide the light emitting device of the repair pixel with a driving current through the corresponding repair line.

9. An organic light emitting display apparatus comprising:
   first and second pixels at a display area;
   a dummy pixel at a dummy area and comprising a compensation capacitive element; and
   a repair line that is connected to the dummy pixel and is connectable to the first and second pixels,
   wherein the dummy pixel comprises:
   a driving transistor configured to output a driving current corresponding to a data signal applied to a gate electrode of the driving transistor; and
   a connection portion between a first electrode of the compensation capacitive element and the gate electrode of the driving transistor, and that electrically connects or separates the first electrode of the compensation capacitive element and the gate electrode of the driving transistor to or from each other based on a physical quantity applied to the connection portion.

10. The organic light emitting display apparatus of claim 9, wherein the dummy pixel further comprises:
   an emission control transistor between an output node connected to the repair line and the driving transistor and is controlled according to an emission control signal;
   a capacitance control transistor between the output node and a second electrode of the compensation capacitive element and is controlled according to the emission control signal; and
   a capacitive element initialization transistor between the capacitance control transistor and an initialization voltage line and is controlled according to an initialization control signal.

11. The organic light emitting display apparatus of claim 9, wherein the connection portion comprises:
   a first area connected to the first electrode of the compensation capacitive element; and
   a second area connected to the gate electrode of the driving transistor,
   wherein the first and second areas are electrically separated from each other, and are electrically connectable to each other by using a laser.

12. The organic light emitting display apparatus of claim 9, wherein the connection portion comprises:
   a first area connected to the first electrode of the compensation capacitive element; and
   a second area connected to the gate electrode of the driving transistor,
   wherein the first and second areas are electrically connected to each other, and are electrically separable from each other by using a laser.

13. The organic light emitting display apparatus of claim 9, wherein each of the first and second pixels comprises a pixel circuit and a light emitting device that is separably connected to the pixel circuit, and
   the dummy pixel comprises a dummy circuit.

14. The organic light emitting display apparatus of claim 13, wherein one of the first and second pixels comprises a repair pixel, and
   a light emitting device of the repair pixel is separated from a pixel circuit of the repair pixel and is connected to the dummy circuit of the dummy pixel through the repair line.

15. The organic light emitting display apparatus of claim 14, wherein the connection portion comprises:
   an emission control transistor between an output node connected to the repair line and the driving transistor and is controlled according to an emission control signal;
   a first capacitance control transistor between the output node and a compensation control node and is controlled according to the emission control signal;
   a capacitive element initialization transistor between the compensation control node and an initialization voltage line and is controlled according to an initialization signal; and
   a second capacitance control transistor between the compensation control node and a second electrode of the compensation capacitive element, and that electrically connects the compensation control node and the second electrode of the compensation capacitive element if the first pixel is the repair pixel, and that electrically separates the compensation control node and the second electrode of the compensation capacitive element if the second pixel is the repair pixel.

16. The organic light emitting display apparatus of claim 14, wherein the dummy circuit of the dummy pixel is configured to provide the light emitting device of the repair pixel with a driving current through the repair line.

* * * * *